US005856008A

United States Patent [19]
Cheong et al.

[11] Patent Number: 5,856,008
[45] Date of Patent: Jan. 5, 1999

[54] ARTICLE COMPRISING MAGNETORESISTIVE MATERIAL

[75] Inventors: Sang-Wook Cheong, Chatham; Harold Yoonsung Hwang, Hoboken, both of N.J.

[73] Assignee: Lucent Technologies Inc., Murray Hill, N.J.

[21] Appl. No.: 869,944

[22] Filed: Jun. 5, 1997

[51] Int. Cl.$^6$ ................................ G11B 5/66; B32B 5/16
[52] U.S. Cl. ..................... 428/402; 428/403; 428/404; 428/692; 428/694 R; 428/694 T; 428/900; 427/127; 427/128; 427/129; 427/130; 360/113; 338/32 R; 324/252; 252/62.51
[58] Field of Search ............................ 428/694 R, 694 T, 428/692, 402, 403, 404; 360/113; 328/32 R; 252/62.51; 324/252; 427/127, 128, 129, 130

[56] References Cited

U.S. PATENT DOCUMENTS

| | | | |
|---|---|---|---|
| 5,422,571 | 6/1995 | Gurney et al. | 324/252 |
| 5,423,373 | 6/1995 | Johnson | 165/297 |
| 5,450,372 | 9/1995 | Jin et al. | 367/140 |
| 5,461,308 | 10/1995 | Jin et al. | 324/117 R |
| 5,538,800 | 7/1996 | Jin et al. | 428/692 |
| 5,541,868 | 7/1996 | Prinz | 365/98 |
| 5,549,977 | 8/1996 | Jin et al. | 428/692 |
| 5,565,695 | 10/1996 | Johnson | 257/295 |
| 5,569,544 | 10/1996 | Daughton | 428/611 |

OTHER PUBLICATIONS

"Spin Polarization of Electrons Tunneling from Films of Fe, Co, Nii and Gd", by Tedrow, P.M. et al., *Physical Review B*, vol. 7, No. 1, pp. 318–326 (Jan. 1, 1973).

"Theory of Tunneling Magnetoresistance in Granular Magnetic Films", by Inoue, J. et al., *Physical Review B*, vol. 53, No. 18, pp. 927–929 (May 1, 1996).

"Spin Polarized Tunneling in Ferromagnet/Insulator/Ferromagnet Junctions," by Miyazaki, T. et al., *Journal of Magnetism and Magnetic Materials*, 151, pp. 403–410 (1995).

"Large Magnetoreistance at Room Temperature in Ferromagnetic Thin Film Tunnel Junctions", by Moodera, J. S. et al., *Physical Review Letters*, vol. 74, No. 16, pp. 3273–3276.

"Observation of Large Low–Field Magnetoresistance in Trilayer Perpendicular Transport Devices Made Using Doped Manganate Perovskites", by Sun, J. Z. et al., *Appl. Phys. Lett.*, 69 (21), pp. 3266–3268 (Nov. 18, 1996).

"Spin–Dependent Electronic Transport in Granular Ferromagnets", by Milner, A. et al., *Physical Review Letters*, vol. 76, No. 3, pp. 475–478 (Jan. 15, 1996).

"Tunneling of Spin–Polarized Electrons and Magnetoresistance in Granular Ni Films", by Helman, J. S., *Physical Review Letters*, vol. 37, No. 21, pp. 1429–1432 (Nov. 22, 1976).

"Grain–Boundary Effects on the Magnetoresistance Properties of Perovskite Manganite Films", by Gupta, A. et al., *Physical Review B*, vol. 54, No. 22, pp. 629–632 (Dec. 1, 1996).

"Spin–Polarized Electron Tunneling", by Meservey, R. et al., *Physics Reports*, vol. 238, No. 4, pp. 175–243 (Mar. 1994).

"Spin–Polarized Intergrain Tunneling in $La_{2/3}Sr_{1/3}MnO_3$", by Hwang H. Y. et al., *Physical Review Letters*, vol. 77, No. 10, pp. 2041–2044 (Sep. 2, 1996).

Lattice Effects on the Magnetoresistance in Doped $LaMnO_2$, by Hwang, H. Y. et al., *Physical Review Letters*, vol. 75, No. 5, pp. 914–917 (Jul. 31, 1995).

U.S. application Ser. No. 08/663,851 filed Sep. 14, 1995 (not attached).

*Primary Examiner*—Leszek Killiman
*Attorney, Agent, or Firm*—Scott J. Rittman

[57] ABSTRACT

An article that uses a magnetoresistive material comprising one or more $CrO_2$ grains having an insulating material, advantageously $Cr_2O_3$, along at least a portion of the grain boundary or boundaries, the magnetoresistive article advantageously exhibiting a magnetoresistance ratio greater than 12% at 5K and 20 kOe.

15 Claims, 2 Drawing Sheets

ARTICLE COMPRISING MAGNETORESISTIVE MATERIAL

BACKGROUND OF THE INVENTION

1. Field of the Invention

The invention relates to articles comprising a magnetoresistive material.

2. Discussion of the Related Art

The magnetoresistance (MR) of a material is typically measured by the resistivity pH of the material in an applied magnetic field H minus the resistivity $\rho_o$ in the absence of an applied magnetic field. This resistivity difference $\Delta\rho$ (equal to $\rho_H-\rho_o$) may be normalized by dividing by $\rho_H$ or $\rho_o$, and is thereby expressed as a magnetoresistance ratio in percent. Resistance values may alternatively be used. Conventional materials such as permalloy typically have a MR ratio of a few percent when normalized by either value.

Materials exhibiting magnetoresistance ratios of greater than a few percent are useful in a variety of devices. The devices utilize the magnetoresistive materials' ability to respond, by way of resistive changes, to small changes in applied magnetic field. This effect is useful, for example, in magnetic sensing devices, current sensing devices, memory elements, or even acoustic devices. Examples of useful devices are discussed, for example, in co-assigned U.S. Pat. Nos. 5,450,372 and 5,461,308, the disclosures of which are hereby incorporated by reference.

Desirable MR has been observed in mixed metal oxides, e.g., La—Ca—Mn—O, La—Ba—Mn—O, and La—Sr—Mn—O. See, e.g., K. Chahara et al., *Applied Physics Letters*, Vol. 63 (14), at 1990; R. von Helmholt et al., *Physical Review Letters*, Vol. 71 (14), at 2331; and co-assigned U.S. Pat. Nos. 5,549,977 and 5,538,800. The magnetoresistance of La-Sr-Mn-O perovskites appears to be better in polycrystalline samples, as opposed to single crystals, possibly due to spin-polarized tunneling of electrons between grains. See H. Y. Hwang et al., *Physical Review Letters*, Vol. 77 (10), at 2041. In particular, it has been found that trilayer structures using La—Ca—Mn—O and La—Sr—Mn—O perovskites undergo a change in resistance by a factor of 2 in a low applied field of 200 Oe, indicating the potential use of such materials in field sensors. See J. Z. Sun et al., *Applied Physics Letters*, Vol. 69 (21), at 3266.

These manganite perovskites, however, have a relatively low Curie temperature, the highest achieved being about 105° C. See, e.g., H. Y. Hwang et al., *Physical Review Letters*, Vol. 75 (5), at 914. The Curie temperature is the temperature above which ferromagnetism disappears. As the temperature moves above and beyond the Curie temperature, magnetoresistance becomes smaller. Devices using such manganite perovskites must therefore be placed in a working environment below the Curie temperature to ensure that the requisite magnetoresistive properties are present. Clearly, magnetoresistive materials having a Curie temperature higher than 105° C. offer commercial potential for a wider range of applications. In addition, the manganite perovskites are relatively difficult to prepare and incorporate into devices such as those discussed above, compared to more conventional metals and oxides.

Thus, magnetoresistive materials that have higher Curie temperatures than current magnetoresistive materials, and which can be produced and incorporated into devices more easily, are desired.

SUMMARY OF THE INVENTION

The invention provides an article that uses a magnetoresistive material comprising $CrO_2$, which has a Curie temperature about 20° C. higher than magnetoresistive manganite perovskites. In addition to the desirable Curie temperature, synthesis techniques for the material have been well developed and the material's characteristics, e.g., oxygen concentration and grain size, are readily controllable. Desirable magnetoresistance is exhibited by $CrO_2$ in which the conductivity is dominated by the effect of grain boundaries. In particular, the $CrO_2$ grains have a relatively thin (e.g., no more than about 50 nm) layer of insulating material located along at least a portion of the grains' boundaries. (An insulating material is a material having a resistivity significantly greater than 2 m$\Omega$-cm.) $CrO_2$, at temperatures of about 350° C. or higher, tends to lose oxygen and transform to an oxygen-depleted Cr oxide, typically $Cr_2O_3$. It is advantageous to use such a Cr oxide as the insulating layer by annealing $CrO_2$ grains at a time and temperature suitable to initiate transformation to the Cr oxide along the grains' boundaries (which will typically transform before the interior of the grains).

A contemplated explanation for the desirable magnetoresistance is spin-polarized tunneling between grains, with the insulating material enhancing the spin-polarization effect. The phenomenon of spin-polarized tunneling is discussed in J. Inoue et al., "Theory of tunneling magnetoresistance in granular magnetic films," *Physical Review B*, Vol. 53, No. 16, at 927, and Miyazaki et al., "Spin polarized tunneling in ferromagnet/insulator/ferromagnet junctions," *Journal of Magnetism and Magnetic Materials*, 151, at 403, the disclosures of which are herein incorporated by reference. The magnetoresistive material in the article of the invention typically exhibits a magnetoresistance ratio, at 5K and 20 kOe, of at least 6% (advantageously at least 12%). Magnetoresistance ratio, in the context of the invention, and as used below, is the value of:

$$\left(\frac{\rho_o - \rho_H}{\rho_o}\right),$$

where $\rho_o$ is the resistivity in the absence of a magnetic field and $\rho_H$ is the resistivity in a magnetic field, H. This magnetoresistance ratio provides desired properties in devices such as magnetic read heads, magnetic field probes, voltage and current sensors, and memory devices.

versus applied field H at 5K for the magnetoresistive material of Example 1, for field values of 60 to −60 kOe.

Figure 2:
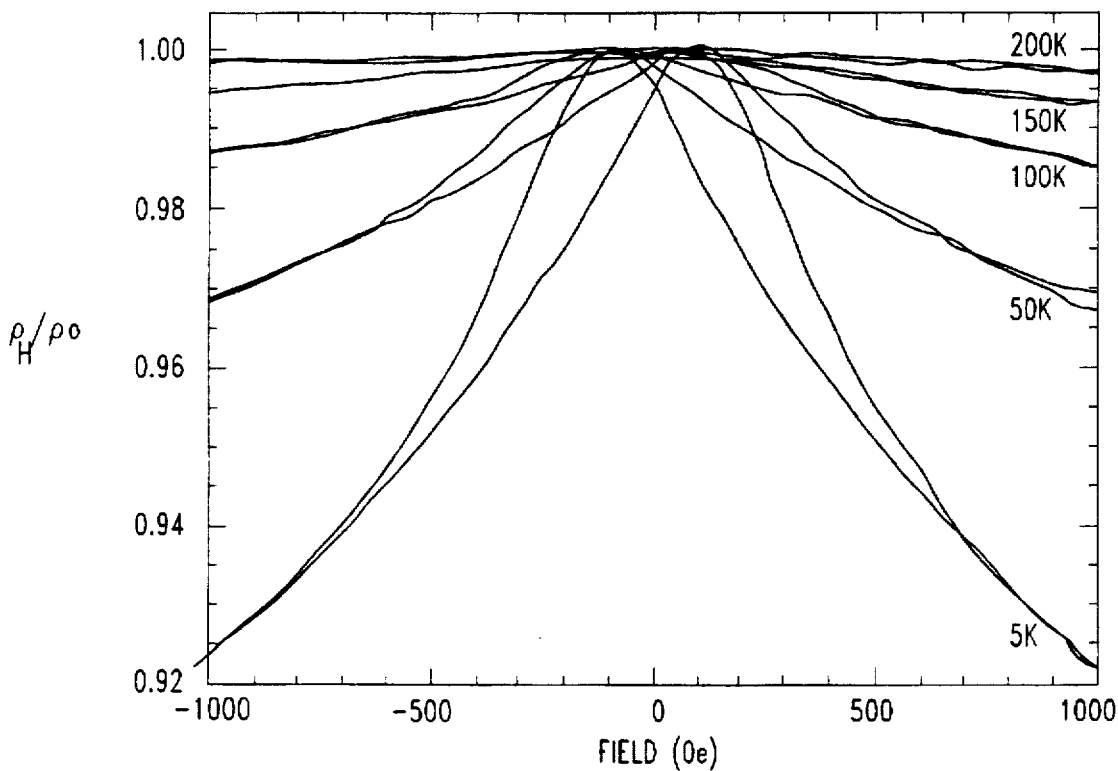

FIG. 2 is a graph of $$\left(\frac{\rho_H}{\rho_o}\right)$$

versus applied field H for the magnetoresistive material of Example 1, at temperatures of 5, 50, 100, 150 and 200K and field values of 1000 to −1000 Oe.

Figure 3:
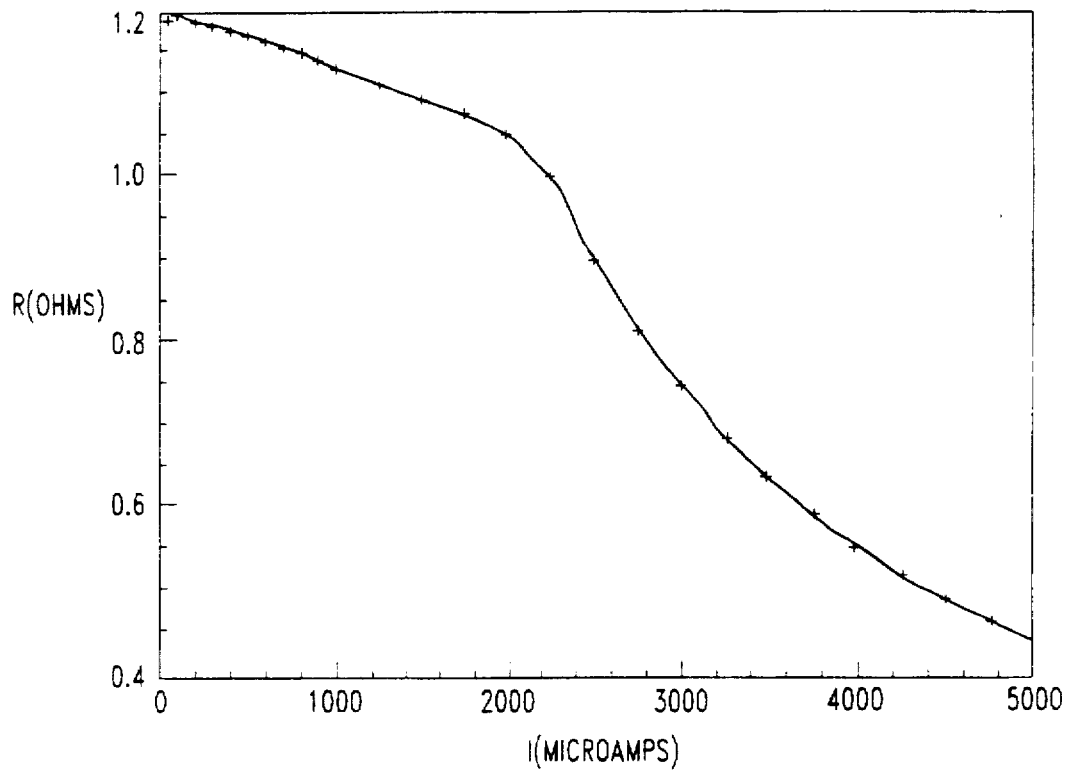

FIG. 3 is a graph of resistance versus applied current at 5K for the magnetoresistive material of Example 1.

Figure 4:
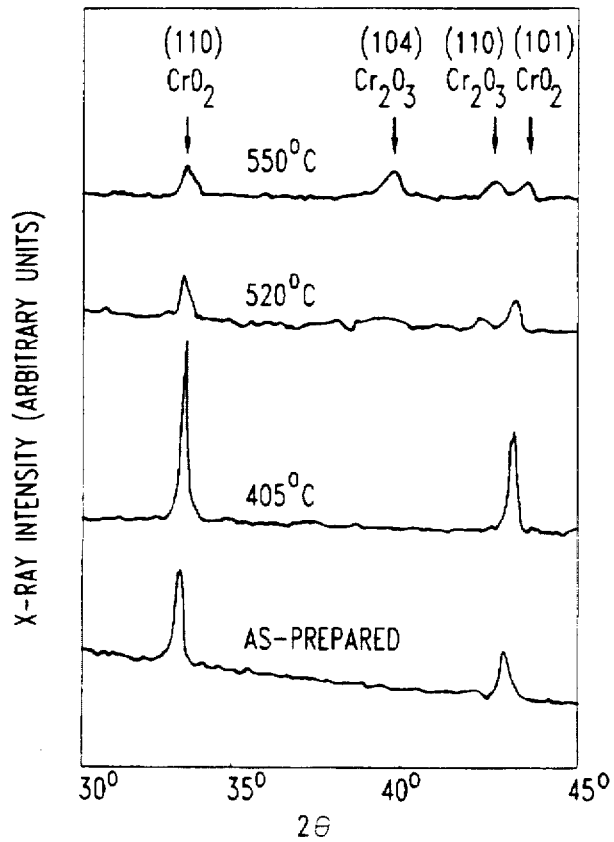

FIG. 4 is a set of x-ray diffraction profiles for $CrO_2$ annealed at various temperatures, showing the increasing presence of $Cr_2O_3$ as anneal temperature is increased.

DETAILED DESCRIPTION OF THE INVENTION

Figure 1:
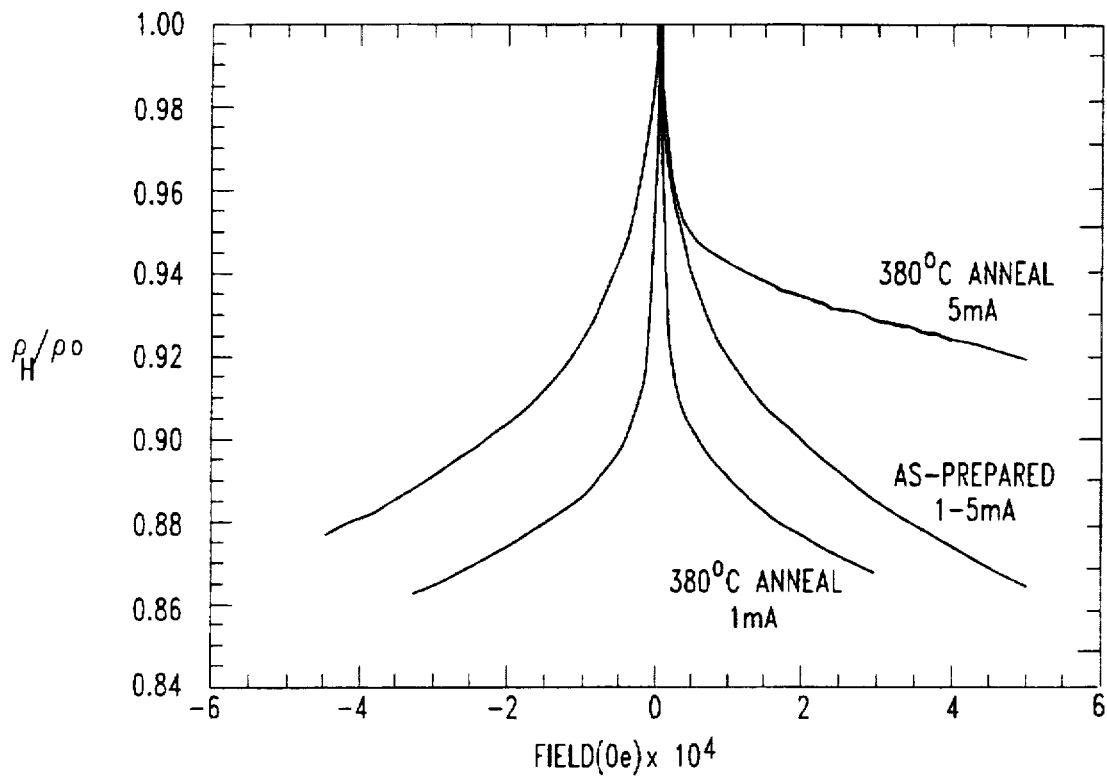
FIG. 1 is a graph of $$\left(\frac{\rho_H}{\rho_o}\right)$$

The invention relates to an article comprising a magnetoresistive material, the material containing $CrO_2$ grains that have an insulating layer located along at least a portion of the grains' boundaries, referred to herein as modified $CrO_2$ grains. The magnetoresistive material exhibits a magnetoresistance ratio, $$\left( \frac{\rho_o - \rho_H}{\rho_o} \right),$$

at 5K and 2 kOe, of at least 6% (advantageously at least 12%). The nature of the magnetoresistance is reflected in FIGS. 1 and 2, which are further discussed in Example 1 below. (The magnetoresistance ratio can also be written as $$\left( 1 - \frac{\rho_H}{\rho_o} \right),$$

and the value of $$\left( \frac{\rho_H}{\rho_o} \right)$$

provided in FIGS. 1 and 2.)

Advantageously, the insulating material is an oxygen-depleted Cr oxide, typically $Cr_2O_3$. The oxygen-depleted region is advantageously obtained by utilizing the tendency of $CrO_2$ to lose oxygen and transform to the oxygen-depleted Cr oxide at temperatures of about 350° C. and higher. This transformation will typically occur first along grain boundaries. During such transformation, it is possible for there to be variations in oxygen content through the oxygen-depleted Cr oxide, such that there are areas which will not meet the stoichiometry of $Cr_2O_3$. Reference herein to $Cr_2O_3$ is intended to encompass such variations. In addition, the crystallinity of the $Cr_2O_3$ region will typically be poorly developed, particularly at the advantageous thickness of about 50 nm or less. It is expected that over half of the $Cr_2O_3$ will therefore be amorphous.

The magnetoresistive material typically will be polycrystalline, meaning that the material has two or more grains. Single crystal $CrO_2$ is possible in certain embodiments, such as the three-layer article discussed below. The modified $CrO_2$ grains are in contact with each other to allow electron transport between grains. Advantageously, at least about 50% of the surface area of the grains are in contact with another grain. Not every $CrO_2$ grain needs to have insulating material located along its grain boundary, but the presence of the insulating material is advantageous, as discussed below. Useful magnetoresistive properties have been found for samples of the magnetoresistive material having isotropic, modified $CrO_2$ grains with diameters ranging from about 0.5 μm to about 50 μm (this measurement including any $Cr_2O_3$ located at grain boundaries). (Isotropic indicates grains having roughly equal diameters in all dimensions.) Materials having isotropic grains with average diameters within this range will be suitable (average diameter indicating the average of all the grains in the material). Other grain sizes are suitable as well. Lower grain sizes, e.g., down to about 0.1 μm, should enhance the magnetoresistance, although such lower grain sizes are typically more difficult to obtain. Advantageously, the thickness of the insulating material located along the grain boundaries of $CrO_2$ grains is not more than about 50 nm.

It was realized that the $CrO_2$ grains of the magnetoresistive material tend to be fully spin polarized within each grain, meaning that the electrons of a single grain have the same spin orientation. This polarization results from a ferromagnetic ordering in the $CrO_2$. In materials that exhibit such spin polarization, electrons within individual grains have the same spin orientation, but the spin orientation of electrons in adjacent grains will typically be different. As discussed in Inoue et al., supra, and Miyazaki et al., supra, the extent of intergrain electron transport in a material is highly dependent on the spin orientation of electrons in adjacent grains. It is relatively difficult for an electron of a certain spin orientation to move across the grains of a material when all the successive grains have electrons of different spin orientations. Upon application of a magnetic field to some spin-polarized materials, at least some of the grains will arrange themselves such that their electrons have the same or similar spins. This granular polarization makes electron transport across successive grains easier and thereby causes the resistivity of the material to decrease. This relationship between applied magnetic field and resistivity is magnetoresistance. However, interactions between electrons located near grain boundaries of adjacent grains often promote electron transport across the boundaries, even in the absence of a magnetic field. These interactions undesirably reduce the magnetoresistance of a material.

In the article of the invention, the presence of insulating material along at least a portion of the $CrO_2$ grains' boundaries provides magnetic decoupling between adjacent grains and reduces such interactions. The insulating material thus becomes the transport barrier, e.g., a tunneling barrier, for electron transport between grains, and thereby enhances the magnetoresistance of the material. The relatively small thickness of the insulating material is advantageous because it is possible for thicker layers to inhibit intergrain electron transport. The desirable magnetoresistance offered by the modified $CrO_2$ grains is reflected in FIG. 1, which shows that the resistivity in the magnetoresistive material of Example 1 decreases with increasing magnetic field. The steepest decrease in resistivity in FIG. 1 occurs at relatively low fields, indicating a high sensitivity at such fields. This low field sensitivity is advantageous in several applications of magnetoresistive materials.

Several methods are available to produce the magnetoresistive material of the article of the invention. It is possible for the magnetoresistive material to be prepared by thermal decomposition of $CrO_3$. The $CrO_3$ powder should be treated at a temperature and pressure suitable to achieve a microstructure of $CrO_2$ grains and then annealed to provide $Cr_2O_3$ along at least a portion of the grains' boundaries. The annealing promotes the transformation of $CrO_2$ to $Cr_2O_3$ along the surfaces of the $CrO_2$ grains. Example 1 reflects such a method. Commercially available chromium dioxide powder has the capability of being similarly treated to achieve this structure. Other methods for obtaining an insulating material along $CrO_2$ grain boundaries are also contemplated.

When an anneal is used to promote the transformation of $CrO_2$ to $Cr_2O_3$, temperatures of about 350° to about 420° C., in air, are useful. Anneals at temperatures above 420° C. appear to result in $Cr_2O_3$ layers of thicknesses that inhibit intergrain electron tunneling, and therefore reduce the magnetoresistance of the material. This result is shown in the examples below, in which $CrO_2$ annealed at 420° C. exhibited a resistivity too high to measure with the equipment used. The time period of the anneal may vary, e.g. from minutes to hours. In addition, it is possible for such annealing to take place in a variety of atmospheres, such as air or oxygen. The particular temperature, time, and atmosphere of the anneal will vary depending on the sample itself, e.g., a bulk sample vs. a thin film. Any other methods of preparation are suitable, provided that such methods result in the above microstructure. It is expected that further increase in the magnetoresistance ratio will be achieved through improvements in the process of production and annealing of the magnetoresistive material.

As recognized in the art, a stray magnetic field opposite to an applied field is generated by the magnetic moment induced by the applied field. Where a material has a large cross-sectional area perpendicular to the applied field, the effect of the stray magnetic field, i.e., the demagnetization effect, on the material will be large. A large demagnetization effect will undesirably cause the reduction of effective field on each grain, and thereby detrimentally affect the magnetoresistive properties. A small cross-sectional area perpendicular to the applied field, e.g., a film, will reduce the demagnetization effect. Thus, it is advantageous for the magnetoresistive material to be disposed as a thin film, i.e., a film having a thickness of about 1 nm up to about 1 μm, or a thick film, i.e., a film having a thickness of about 1 μm to about 100 μm. Use of such films reduces the demagnetization effect in the magnetoresistive material. It is possible to prepare a film of $CrO_2$ by methods such as molecular beam epitaxy, sputtering, pulsed laser deposition, or a sol-gel method utilizing $CrO_3$ as the starting material.

The article of the invention utilizes the magnetoresistive material's ability to respond by way of resistive changes to small changes in applied magnetic field. Examples of articles include sensor devices such as magnetic read heads, magnetic field probes, or voltage or current sensors in electrical devices. Thin films of the material would be particularly useful for memory devices, in particular non-volatile DRAMs. Other examples of suitable devices that rely upon a magnetoresistive material are discussed, for example, in co-assigned U.S. Pat. Nos. 5,450,372 and 5,461,308, referenced above, as well as U.S. Pat. Nos. 5,422,571; 5,565,695; 5,541,868; and 5,432,373, the disclosures of which are hereby incorporated by reference.

One contemplated device, utilizing the same characteristics found in the magnetoresistive material, contains a MR structure that is formed from two layers of chromium dioxide separated by a thin, e.g., 50 nm or less, layer of an insulating material, e.g., $Cr_2O_3$. Advantageously, the chromium dioxide layers are single crystal. The thin layer of insulating material will lie along the boundaries of the $CrO_2$ grains, and will act in the manner discussed above. The conductivity through this three-layer structure depends in part on the orientation of the grains in the two separate chromium dioxide layers, in accordance with the principles discussed in Moodera et al., "Large Magnetoresistance at Room Temperature in Ferromagnetic Thin Film Tunnel Junctions," *Physical Review Letters*, Vol. 74, No. 16, at 3273, the disclosure of which is hereby incorporated by reference. It is possible for this three-layer structure to be present in a variety of devices, including those listed above. Such a three-layer structure is capable of being prepared by forming a layer of chromium dioxide by methods such as molecular beam epitaxy, sputtering, pulsed laser deposition, or a sol-gel method utilizing $CrO_3$ as the starting material, treating the layer to convert the surface to $Cr_2O_3$, and forming the second chromium dioxide layer thereon.

EXAMPLE 1

$CrO_3$ powder was placed in a gold capsule. The gold capsule was pressurized to 35 kbar and heated at 520° C. for 2 hours in a piston-cylinder type high pressure furnace. The heat was then turned off and, when the temperature reached room temperature, the pressure was removed. The 20 resultant sample consisted of $CrO_2$ with substantially the entire volume having isotropic grains with diameters ranging from about 0.5 μm to about 5 μm, as estimated by optical microscopy. The magnetoresistance of the as-prepared sample at 5K and for applied currents of 1 to 5 mA (the material showed no current dependence in this range) is shown in FIG. 1. The magnetoresistance ratio, $$\left( \frac{\rho_o - \rho_H}{\rho_o} \right),$$

for this sample at 20 kOe is shown to be about 10%.

In addition, the effect of annealing the $CrO_2$ sample was investigated. The sample was annealed for 30 minutes in air at a temperature of 380° C. The magnetoresistance of the annealed sample, at 5K and at applied currents of 1 mA and 5 mA, is also shown in FIG. 1. The 1 mA graph shows improved magnetoresistance over the non-annealed sample. The magnetoresistance ratio at 20 kOe and 1 mA is about 12%. As discussed above, it is believed that this improved magnetoresistance over the non-annealed sample is due to the partial transformation of $CrO_2$ to $Cr_2O_3$ along the surfaces of the $CrO_2$ grains. Because the $Cr_2O_3$ layer is believed to be on the order of tens of nanometers, it was not, and was not expected to be, visible under the optical microscope. At 20 kOe and 5 mA, the magnetoresistance ratio of the annealed sample was about 6%, this lower ratio due to a detrimental current effect on the material.

FIG. 2 shows the magnetoresistance versus applied field for the annealed sample, at temperatures of 5, 50, 100, 150 and 200K and field values of 1000 to −1000 Oe. The graph reflects the expected behavior for a magnetoresistive material. FIG. 3 shows the resistance versus applied current at 5K for the annealed sample, and shows the non-linear current dependence that is reflected in the 5 mA magnetoresistance ratio of FIG. 1.

A sample annealed at 420° C. for 30 minutes in air was too resistive to measure with the set-up used in the above tests.

In these experiments, resistivity was measured using a standard four-probe method. Magnetoresistance up to 5 Tesla was measured using a Quantum Design PPMS.

EXAMPLE 2

X-ray data was taken on samples made in accordance with the method of Example 1, with varied anneals, in order to examine the formation of $Cr_2O_3$. Specifically, as shown in FIG. 4, x-ray patterns were run for a non-annealed sample, and for samples annealed at 400° C. (not shown), 405° C., 520° C., and 550° C. The x-ray patterns of the non-annealed sample and the sample annealed at 400° C. did not show characteristic $Cr_2O_3$ peaks. The peaks characteristic of $Cr_2O_3$ are barely detectable even in the sample annealed at 405° C. The sample annealed at 520° C. showed definite peaks characteristic of $Cr_2O_3$, and the sample annealed at 550° C. showed strong, sharp peaks characteristic of $Cr_2O_3$. This trend, in combination with the results of Example 1, indicated that anneal temperatures of about 360°–405° C. produced thin layers $Cr_2O_3$, but not in amounts large enough to detect with x-ray diffraction.

Other embodiments of the invention will be apparent to those skilled in the art from consideration of the specification and practice of the invention disclosed herein.

What is claimed is:

1. An article comprising a magnetoresistive material that comprises one or more $CrO_2$ grains having an insulating material along at least a portion of the $CrO_2$ grain boundary or boundaries.

2. The article of claim 1, wherein the insulating material comprises $Cr_2O_3$.

3. The article of claim 2, wherein the insulating material has a thickness of about 50 nm or less.

4. The article of claim 1, wherein the magnetoresistance ratio is at least 6%, at 5K and 20 kOe.

5. The article of claim 4, wherein the magnetoresistance ratio is at least 12%, at 5K and 20 kOe.

6. The article of claim 1, wherein the magnetoresistive material is disposed in the article as a layer having a thickness of about 1 nm to about 100 μm.

7. The article of claim 1, wherein the magnetoresistive material comprises two or more $CrO_2$ grains having an average grain size of about 0.5 μm to about 50 μm.

8. An article comprising a magnetoresistive structure that comprises a first layer consisting essentially of $CrO_2$, a second layer consisting essentially of $Cr_2O_3$, and a third layer consisting essentially of $CrO_2$.

9. The article of claim 8, wherein the $CrO_2$ in the first and third layers is single crystal $CrO_2$.

10. A method for making an article that comprises a magnetoresistive material, comprising the step of treating $CrO_2$ to form $Cr_2O_3$ along at least a portion of the grain boundary or boundaries of the $CrO_2$.

11. The method of claim 10, wherein the $Cr_2O_3$ has a thickness of about 50 nm or less.

12. The method of claim 10, wherein the magnetoresistive material exhibits a magnetoresistance ratio greater than 6%, at 5K and 20 kOe.

13. The method of claim 10, wherein the $CrO_2$ has an average grain size of about 0.5 μm to about 50 μm.

14. The method of claim 10 wherein the treatment is an anneal at a temperature between about 350° and about 420° C.

15. The method of claim 10, wherein the $CrO_2$ is formed by treating $CrO_3$.

* * * * *